US010928224B2

(12) United States Patent
Cui et al.

(10) Patent No.: US 10,928,224 B2
(45) Date of Patent: Feb. 23, 2021

(54) MULTI-TURN ABSOLUTE ENCODER, ENCODING METHOD AND ROBOT

(71) Applicant: INNFOS DRIVE(BEIJING)TECHNOLOGIES CO., LTD., Beijing (CN)

(72) Inventors: Haotian Cui, Beijing (CN); Xunge Yan, Beijing (CN); Wei Zhu, Beijing (CN)

(73) Assignee: INNFOS DRIVE (BEIJING) TECHNOLOGIES CO., LTD., Beijing (CN)

( * ) Notice: Subject to any disclaimer, the term of this patent is extended or adjusted under 35 U.S.C. 154(b) by 218 days.

(21) Appl. No.: 16/364,615

(22) Filed: Mar. 26, 2019

(65) Prior Publication Data

US 2020/0200572 A1 Jun. 25, 2020

(30) Foreign Application Priority Data

Dec. 24, 2018 (CN) ......................... 201811581907.6

(51) Int. Cl.

| | |
|---|---|
| ***G01R 33/07*** | (2006.01) |
| ***G01D 5/244*** | (2006.01) |
| ***B25J 9/12*** | (2006.01) |
| ***G01D 5/249*** | (2006.01) |

(52) U.S. Cl.

CPC .......... *G01D 5/24485* (2013.01); *B25J 9/126* (2013.01); *G01D 5/2497* (2013.01); *G01D 5/24495* (2013.01); *G01R 33/072* (2013.01)

(58) Field of Classification Search

CPC .. B25J 9/12; B25J 9/126; G01D 5/244; G01D 5/249; G01D 5/145; G01D 5/24485; G01D 5/24495; G01D 5/2497; G01R 33/07; G01R 33/072

USPC ........................................................ 324/207.2

See application file for complete search history.

(56) References Cited

FOREIGN PATENT DOCUMENTS

| | | | |
|---|---|---|---|
| CN | 102486383 | A | 6/2012 |
| CN | 102506907 | A | 6/2012 |
| CN | 105716634 | A | 6/2016 |
| CN | 206291915 | U | 6/2017 |
| CN | 107367289 | A | 11/2017 |

(Continued)

OTHER PUBLICATIONS

First Chinese Office Action dated Jul. 18, 2019; Appln. No. 201811581907.6.

(Continued)

*Primary Examiner* — Farhana A Hoque
*Assistant Examiner* — Courtney G McDonnough

(57) ABSTRACT

A multi-turn absolute encoder, an encoding method and a robot are disclosed. The multi-turn absolute encoder includes a rotary shaft, a control circuit board, a magnet, a Hall sensor, a controller, a primary controller, a single-turn absolute encoder and a non-volatile memory. One side of the control circuit board is vertically provided with the rotary shaft. The magnet is connected to the rotary shaft and configured to synchronously rotate about the rotary shaft. The Hall sensor is configured to acquire turn count information of the rotary shaft upon power interruption. The primary controller is configured to calculate an absolute position information of the rotary shaft based on the turn count information of the rotary shaft, a relative position information of the rotary shaft and the absolute position information of the rotary shaft stored in previous power interruption.

20 Claims, 8 Drawing Sheets

100
1
3
2
7
6
8

(56) References Cited

FOREIGN PATENT DOCUMENTS

| | | | |
|---|---|---|---|
| CN | 206756198 | U | 12/2017 |
| CN | 108880122 | A | 11/2018 |
| DE | 10311412 | B3 | 5/2004 |
| EP | 0331828 | A1 | 9/1989 |
| EP | 1353151 | A1 | 10/2003 |
| JP | 2000275066 | A | 10/2000 |

OTHER PUBLICATIONS

Extended European Search Report dated Oct. 2, 2019; EP 19164359.
2.

MULTI-TURN ABSOLUTE ENCODER, ENCODING METHOD AND ROBOT

CROSS-REFERENCE TO RELATED APPLICATIONS

The present disclosure claims priority to Chinese Patent Application No. 201811581907.6, filed with the Chinese Patent Office on Dec. 24, 2018, titled "MULTI-TURN ABSOLUTE ENCODER, ENCODING METHOD, CONTROLLER AND STORAGE MEDIUM", the entire contents of which are incorporated herein by reference.

TECHNICAL FIELD

The present disclosure relates to the technical field of rotary encoders, and in particular, relates to a multi-turn absolute encoder, an encoding method and a robot.

BACKGROUND

A rotary encoder is also referred to as a shaft encoder and is an electromechanical device which converts a rotation position or rotation amount into an analog or digital signal, which is generally disposed on the side which is perpendicular to a rotary shaft in a rotary object. The rotary encoder is applicable to scenarios where the rotation position and speed need to be accurately and precisely measured, for example, industry control, robot technologies, dedicated lens, computer input devices (for example, mice and trajectory balls) or the like.

The rotary encoder includes absolute encoder and incremental encoder. The absolute encoder also includes single-turn absolute encoder and multi-turn absolute encoder.

After a system is power interrupted, the multi-turn absolute encoder may still maintain position information thereof. After the system is powered on, an current absolute position of the rotary shaft may be directly read. A relationship between an encoder value and a physical position of controlled machinery is defined during assembling, and the system may maintain the position information with no need of returning to a calibration point. The absolute position of the rotary shaft refers to a position that is manually defined during installation of the rotary shaft, and the absolute position includes absolute position information of a single turn and turn count information.

At present, the multi-turn absolute encoders are mostly optical multi-turn absolute encoders, and include mechanical gear sets. The turn count is recorded by using the mechanical gear set. The optical multi-turn absolute encoder performs detection by a grating code disc based on an optical detection method.

With respect to the multi-turn absolute encoder, after the system is power interrupted, the absolute position of the rotary shaft may not be lost. After the system is powered on again, the position of the rotary shaft may be directly read.

SUMMARY

An embodiment of the present disclosure provides a multi-turn absolute encoder. The multi-turn absolute encoder includes a rotary shaft, wherein the multi-turn absolute encoder further includes:

a control circuit board, one side of which is vertically provided with the rotary shaft;

a magnet, disposed on one side of the control circuit board, connected to the rotary shaft, and configured to synchronously rotate about the rotary shaft;

a Hall sensor, disposed at a position corresponding to the magnet on the other side of the control circuit board, and configured to acquire turn count information of the rotary shaft upon power interruption;

a controller, disposed on the control circuit board, electrically connected to the Hall sensor, power supplied by a battery, and configured to acquire data of the Hall sensor upon power interruption;

a primary controller, disposed on the control circuit board, and electrically connected to the controller;

a single-turn absolute encoder, disposed at a position below the magnet on one side of the control circuit board, electrically connected to the primary controller, and configured to acquire relative position information of the rotary shaft upon power on; and a non-volatile memory, disposed on the control circuit board, electrically connected to the primary controller, and configured to, in power interruption, store absolute position information of the rotary shaft calculated by the primary controller prior to power interruption;

wherein the primary controller is configured to calculate the absolute position information of the rotary shaft based on the turn count information of the rotary shaft, the relative position information of the rotary shaft and the absolute position information of the rotary shaft stored in previous power interruption. a method for video search. The method includes:

Another embodiment of the present disclosure provides an encoding method of the multi-turn absolute encoder as defined above. The method includes:

in power interruption, storing, by the non-volatile memory, the absolute position information of the rotary shaft calculated by the primary controller prior to power interruption;

upon power interruption, in a first mode, controlling, by the controller, the Hall sensor to start operating, and acquiring the turn count information of the rotary shaft via the Hall sensor;

upon power on, in a second mode, controlling, by the controller, the Hall sensor not to operate, and acquiring, by the primary controller, the relative position information of the rotary shaft via the single-turn absolute encoder;

reading, by the primary controller, the absolute position information of the rotary shaft stored by the non-volatile memory in previous power interruption, the turn count information of the rotary shaft acquired by the controller upon power interruption, and the relative position information of the rotary shaft acquired by the single-turn absolute encoder upon power on; and calculating, by the primary controller the absolute position information of the rotary shaft based on the absolute position information of the rotary shaft stored in the previous power interruption, the turn count information of the rotary shaft and the relative position information of the rotary shaft.

Still another embodiment of the present disclosure provides a robot. The robot includes a multi-turn absolute encoder, wherein the multi-turn absolute encoder includes a rotary shaft, and wherein the multi-turn absolute encoder further includes:

a control circuit board, one side of which is vertically provided with the rotary shaft;

a magnet, disposed on one side of the control circuit board, connected to the rotary shaft, and configured to synchronously rotate about the rotary shaft;

a Hall sensor, disposed at a position corresponding to the magnet on the other side of the control circuit board, and configured to acquire turn count information of the rotary shaft upon power interruption;

a controller, disposed on the control circuit board, electrically connected to the Hall sensor, power supplied by a battery, and configured to acquire data of the Hall sensor upon power interruption;

a primary controller, disposed on the control circuit board, and electrically connected to the controller;

a single-turn absolute encoder, disposed at a position below the magnet on one side of the control circuit board, electrically connected to the primary controller, and configured to acquire relative position information of the rotary shaft upon power on; and a non-volatile memory, disposed on the control circuit board, electrically connected to the primary controller, and configured to, in power interruption, store absolute position information of the rotary shaft calculated by the primary controller prior to power interruption;

wherein the primary controller is configured to calculate the absolute position information of the rotary shaft based on the turn count information of the rotary shaft, the relative position information of the rotary shaft and the absolute position information of the rotary shaft stored in previous power interruption.

BRIEF DESCRIPTION OF THE DRAWINGS

One or more embodiments are illustrated by way of example, and not by limitation, in the figures of the accompanying drawings, wherein components having the same reference numeral designations represent like components throughout. The drawings are not to scale, unless otherwise disclosed.

DETAILED DESCRIPTION

Figure 1:
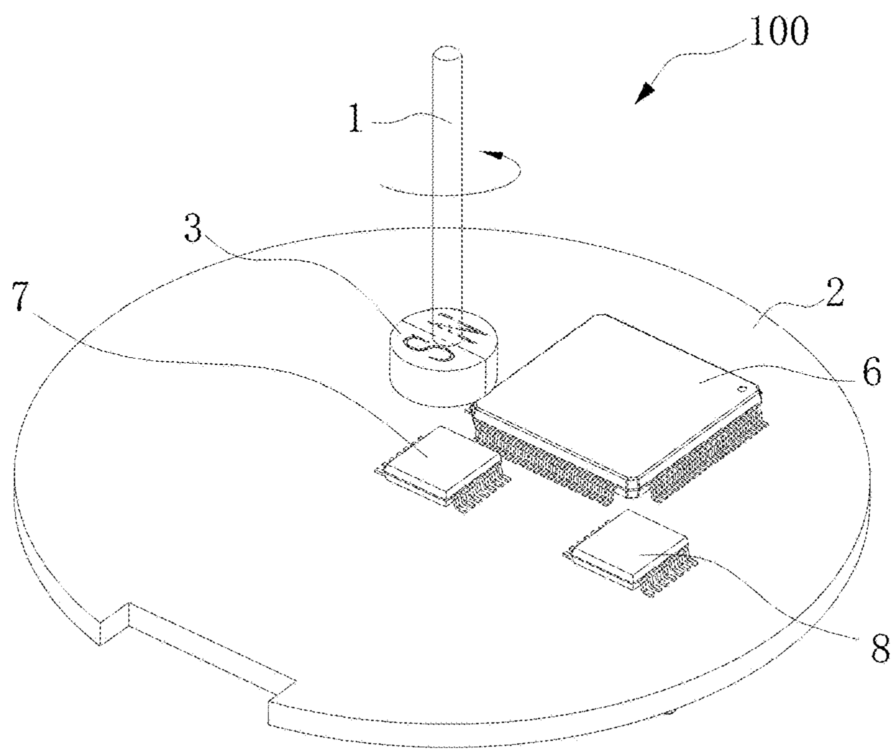
FIG. 1 is a schematic structural diagram of one side of a multi-turn absolute encoder according to an embodiment of the present disclosure.
Figure 2:
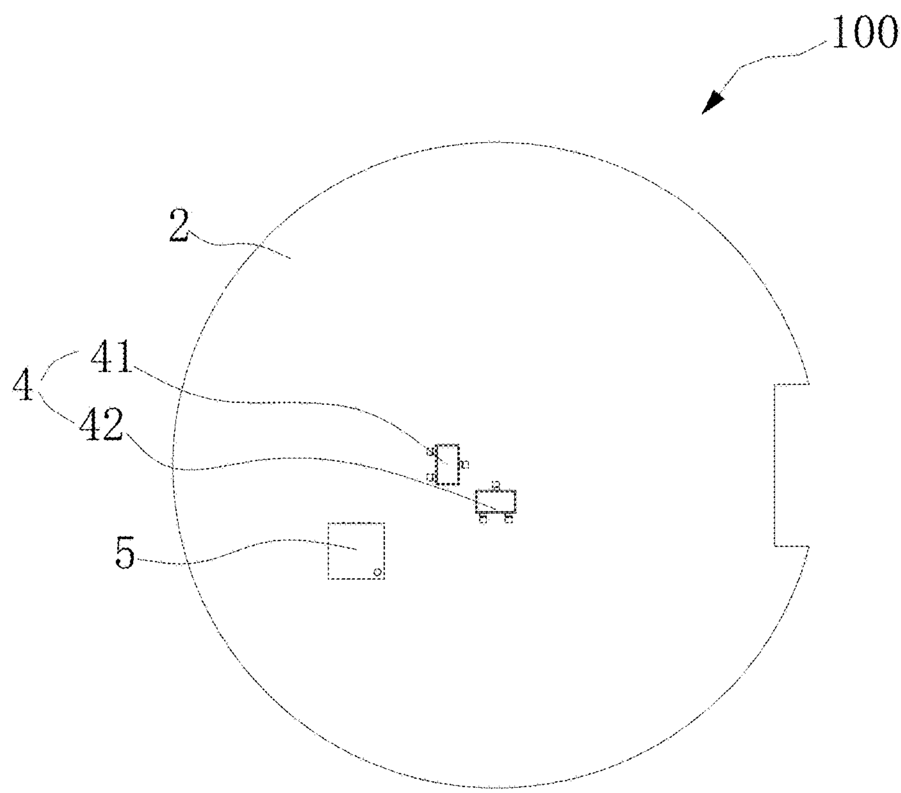
FIG. 2 is a schematic structural diagram of the other side of a multi-turn absolute encoder according to an embodiment of the present disclosure.
Figure 3:
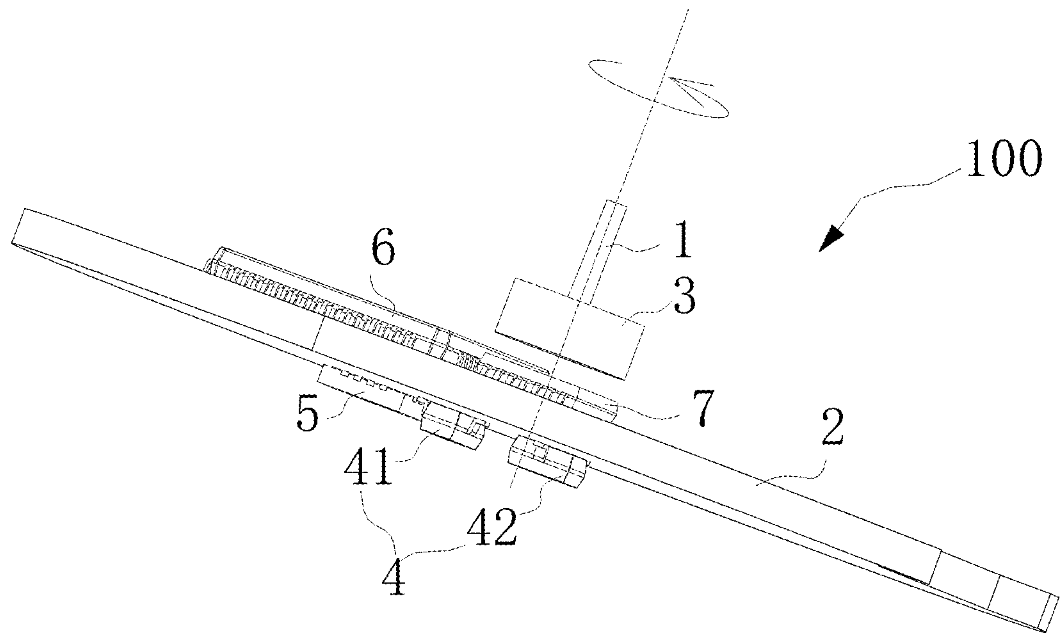
FIG. 3 is a schematic axial structural diagram of a multi-turn absolute encoder according to an embodiment of the present disclosure.
Figure 4:
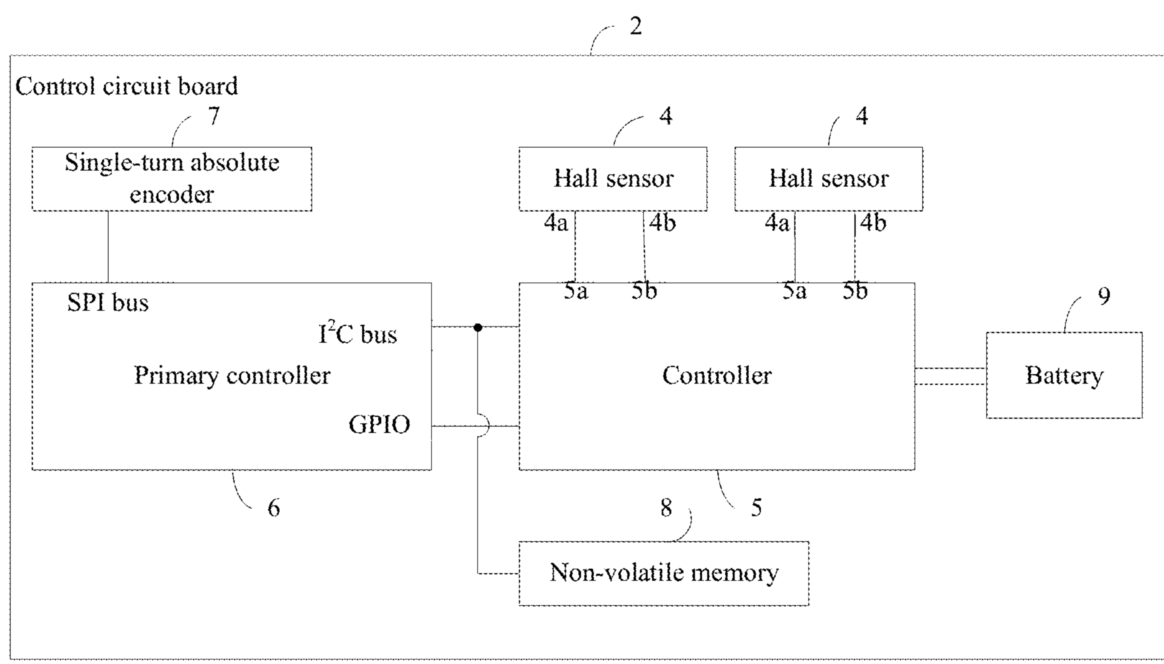
FIG. 4 is a circuit structural block diagram of a control circuit board in a multi-turn absolute encoder according to an embodiment of the present disclosure.

For clear description of objectives, technical schemes, and advantages of the present disclosure, the present disclosure is further described in detail below by reference to the embodiments and the accompanying drawings. It should be understood that the embodiments described here are only exemplary ones for illustrating the present disclosure, and are not intended to limit the present disclosure.

The multi-turn absolute encoder according to the embodiment of the present disclosure is applicable to scenarios where the rotation position and speed need to be accurately and precisely measured, for example, industry control, robot technologies, dedicated lens, computer input devices (for example, mice and trajectory balls) or the like. The encoder is generally disposed on the side which is perpendicular to a rotary shaft in a rotary object, and configured to measure the rotation position of the rotary object.

As illustrated in FIG. 1 to FIG. 4, an embodiment of the present disclosure provides a multi-turn absolute encoder 100. The multi-turn absolute encoder 100 includes rotary shaft 1, a control circuit board 2, a magnet 3, a Hall sensor 4, a controller 5, a primary controller 6, a single-turn absolute encoder 7 and a non-volatile memory 8.

In this embodiment, the rotary shaft 1, the magnet 3, the primary controller 6 and the single-turn absolute encoder 7 are disposed on one side of the control circuit board 2, and the Hall sensor 4, the controller 5 and the non-volatile memory 8 are disposed on the other side of the control circuit board 2. The rotary shaft 1 is perpendicular to a radial plane of the control circuit board 2, and the magnet 3 is connected to the rotary shaft 1 and configured to synchronously rotate about the rotary shaft 1. The magnet 3 may be fixedly connected to the rotary shaft 1. For example, the magnet 3 is adhered to the rotary shaft 1. The magnet 3 may employ a neodymium-iron-boron magnet, which is plated with nickel and radially remagnetized. The rotary shaft 1 and the magnet 3 are not connected to the control circuit board 2, and neither the rotary shaft 1 and the magnet 3 is in contact with the control circuit board 2. These two parts are spaced apart from the control circuit board 2 by a specific gap. It may be understood that the rotary shaft 1 is fixedly connected to an object under test, and the object under test rotates to drive the rotary shaft 1 to rotate, such that the magnet 3 is driven to rotate.

It may be further understood that in other embodiments, positions of the above parts on the control circuit board 2 or positions thereof relative to the control circuit board 2 may be defined otherwise. For example, the rotary shaft 1, the magnet 3, the single-turn absolute encoder 7, the controller 5 and the non-volatile memory 8 may be disposed on one side of the control circuit board 2, and the primary controller 6 and the Hall sensor 4 may be disposed on the other side of the control circuit board 2. Arrangements of these parts are not limited to those specified in this embodiment.

The Hall sensor 4 is disposed at a position corresponding to the magnet on the other side of the control circuit board 2. That is, the Hall sensor 4 is disposed rightly under the magnet 3, and configured to acquire turn count information of the rotary shaft 1 upon power interruption. In this embodiment, the Hall sensor 4 includes a first bipolar Hall sensor 41 and a second bipolar Hall sensor 42. The first bipolar Hall sensor 41 and the second bipolar Hall sensor 42 are orthogonally disposed on the control circuit board 2, and a distance between the Hall sensor 4 and the magnet 3 is less than or equal to 2.5 mm. The term "bipolar" refers to magnetic polarity.

Figure 5:
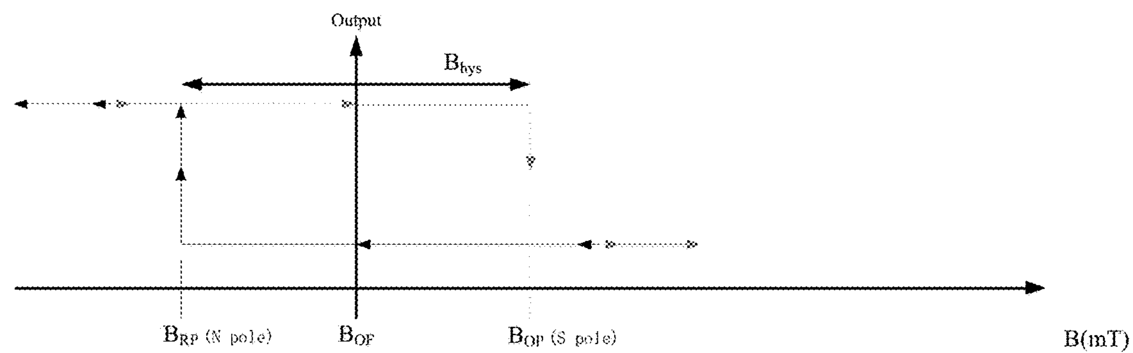
FIG. 5 is a schematic diagram of a hysteretic interval of a bipolar Hall sensor according to an embodiment of the present disclosure.
Figure 6:
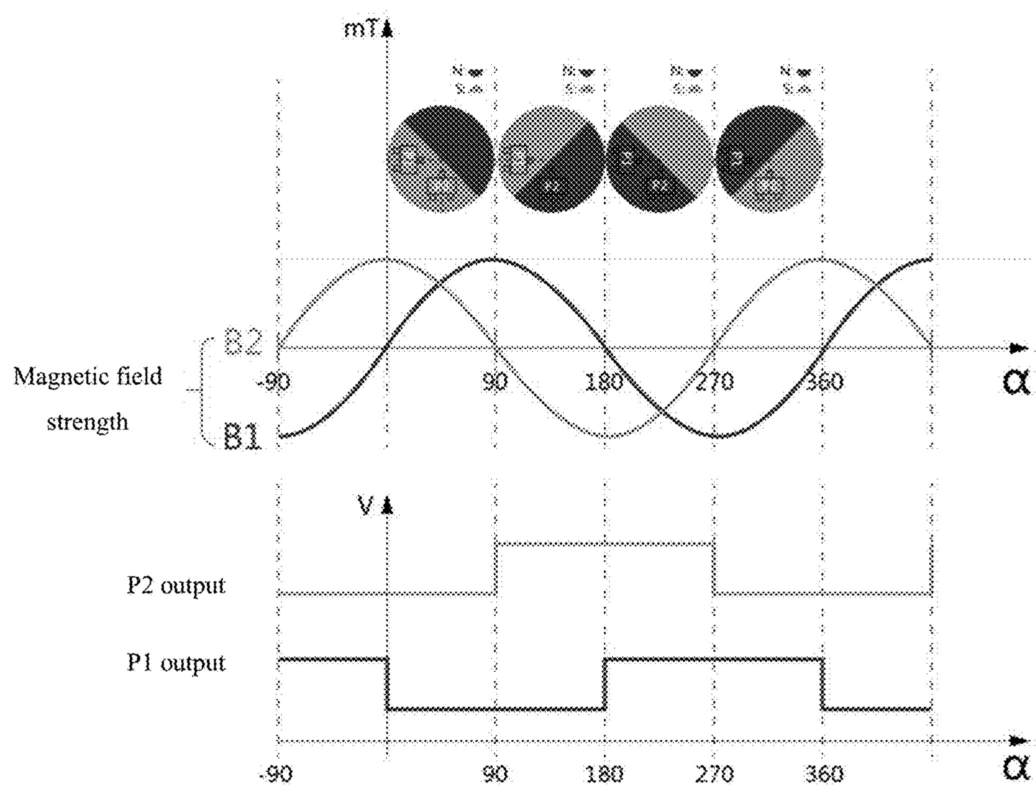
FIG. 6 is a schematic diagram of output features of an orthogonal Hall sensor according to an embodiment of the present disclosure.

The bipolar Hall sensor has a hysteretic feature. When the N pole of a magnetic field is close to the bipolar Hall sensor, a magnetic field strength is less than $B_{RP}$. $B_{RP}$ is a magnetic field release point, and is a magnetic field strength causing a Hall device to be turned off. In this case, the bipolar Hall sensor outputs a high level. When the S pole of a magnetic field is close to the bipolar Hall sensor, a magnetic field strength is greater than BOP. BOP is a magnetic field operation point, and is a magnetic field strength causing a Hall device to be turned on. In this case, the bipolar Hall sensor outputs a low level. Assume that the magnetic field strength is B, and a hysteretic interval of the bipolar Hall sensor is $B_{RP}<B<B_{OP}$, then as illustrated in FIG. 5, $B_{hys}=|B_{OP}-B_{RP}|$, wherein $B_{hys}$ is a hysteretic window of a magnetic switch point of the bipolar Hall sensor. A transmission function of the Hall device is to filter small fluctuation values of the magnetic field possibly caused by mechanical vibrations or electromagnetic noise in application by using a difference value between the switch points.

The bipolar Hall sensor is designed as a sensitive switch. Bipolar switches have consistent hysteresis. However, difference devices have different ranges of switch points at the positive pole or the negative pole. Since the polarity of the magnetic field needs to be changed to ensure switching of the switch point, and consistent hysteresis is needed to ensure the period, the bipolar Hall sensors need to be disposed densely, with the S and N poles alternating. When the rotary shaft rotates, the magnetic field region shifts relative to the bipolar Hall sensor. The bipolar Hall sensor is subject to the closest magnetic field. When the bipolar Hall sensor is opposite to the S pole of the magnetic field, the bipolar Hall sensor is turned on; and when the bipolar Hall sensor is opposite to the N pole of the magnetic field, the bipolar Hall sensor is turned off.

Output feature of the orthogonal Hall sensor are as illustrated in FIG. 5. Two sensors are orthogonally disposed and respectively marked by P1 and P2. The magnet is disposed rightly above the orthogonal Hall sensors. When the magnet rotates by one turn, corresponding outputs of P1 and P2 have four states, 00, 01, 11 and 10. Based on these four states, whether the rotary shaft forwardly rotates or backwardly rotates may be judged, and a turn count of rotation may be determined. The turn count information of the rotary shaft acquired by the orthogonal Hall sensor has a low precision. One turn of rotation of the rotary shaft is 360 degrees, and a maximum precision of the turn count of rotation acquired by the orthogonal Hall sensor is 90 degrees, and a resolution thereof is 0.25 turn, which may only be used to acquire the turn count of rotation of the rotary shaft.

The controller 5 is disposed on the control circuit board 2, electrically connected to the Hall sensor 4, and power supplied by a battery 9. The controller 5 operates when the system power is interrupted. The controller 5 is configured to acquire data of the Hall sensor 4 upon power interruption. In this embodiment, the controller 5 is a low power consumption controller, and rotates by power supply by the battery 9. Therefore, the controller 5 consumes less power. The controller 5 is connected to a power pin 4*a* and a signal output pin 4*b* of the Hall sensor 4 respectively via a first pin 5*a* and a second pin 5*b*, and configured to open the first pin 5*a* in power interruption such that the first pin 5*a* is in communication with the power pin 4*a* to supply power for the Hall sensor 4 such that the Hall sensor 4 starts operating upon power interruption. The first pin 5*a* and the second pin 5*a* are both general purpose input output (GPIO) pins.

The primary controller 6 is disposed on the control circuit board 2, and electrically connected to the controller 5. In this embodiment, the primary controller 6 is connected to the controller 5 via an $I^2C$ bus, and performs data read/write operations via the respective GPIO pin. The primary controller 6 is connected to the single-turn absolute encoder 7 via an SPI bus.

The low power consumption controller and the primary controller 6 may both employ an integrated circuit (IC) chip.

The single-turn absolute encoder 7 is disposed at a position under the magnet 3 on one side of the control circuit board 2, that is, rightly under the magnet 3. The single-turn absolute encoder 7 is electrically connected to the primary controller 6, and configured to acquire relative position information of the rotary shaft 1 upon power on. In this embodiment, the single-turn absolute encoder 7 employs a high precision magnetic single-turn absolute rotary encoder. Position information acquired by this encoder is high precision turn count information. For example, with respect to 360 degrees of one turn, the precision may reach 0.02 degree, which indicates the position of the rotary shaft 1. The distance between the single-turn absolute encoder 7 and the magnet 3 is less than or equal to 2 mm.

The non-volatile memory 8 is disposed on the control circuit board 2 and electrically connected to the primary controller 6, and is configured to store, in power consumption, absolute position information of the rotary shaft 1 calculated by the primary controller 6 prior to power interruption. In this embodiment, the non-volatile memory 8 employs an electrically erasable programmable read-only memory (EEPROM).

The primary controller 6 reads absolute position information of the rotary shaft 1 stored by the non-volatile memory 8 in the previous power interruption, turn count information of the rotary shaft 1 acquired by the controller 5 upon power interruption, and relative position information of the rotary shaft 1 acquired by the single-turn absolute encoder 7 upon power on, and calculates the absolute position information of the rotary shaft 1 based on the above stored information.

In the multi-turn absolute encoder according to the embodiment of the present disclosure, the magnet connected to the rotary shaft is disposed, the rotary shaft rotates to drive the magnet to synchronously rotate, the relative position information of the rotary shaft is acquired by the single-turn absolute encoder based on rotation of the magnet upon power on, the controller controls the Hall sensor to acquire the turn count information of the rotary shaft based on rotation of the magnet upon power interruption, the primary controller calculates the absolute position information of the rotary shaft based on the turn count information of the rotary shaft, the relative position information of the rotary shaft and the absolute position information of the rotary shaft stored in previous power interruption. As compared with the multi-turn absolute encoder in the prior art, the multi-turn absolute encoder according to the embodiment of the present disclosure does not employ a mechanical gear set, and thus has a simple structure, a small size and a low cost and may be simply integrated. In addition, the measurement scope is not restricted. Since no grating code disc is used, no higher requirement is imposed on the use environment.

Figure 7:
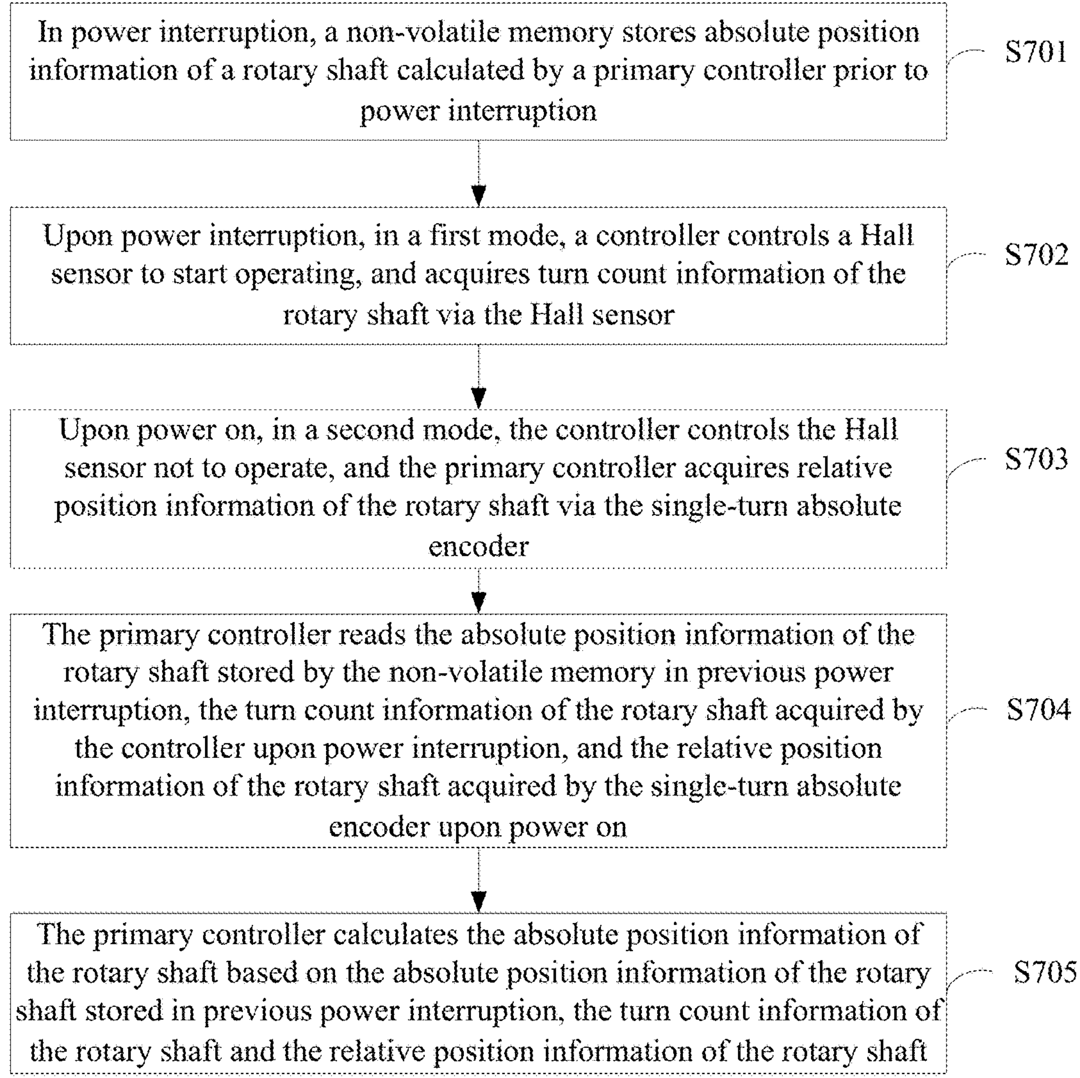
FIG. 7 is a flowchart of an encoding method of a multi-turn absolute encoder according to an embodiment of the present disclosure.

As illustrated in FIG. 7, an embodiment of the present disclosure provides an encoding method of the multi-turn absolute encoder. The method is applied to the multi-turn absolute encoder as described in the above embodiment, and includes the following steps:

Step 701: In power interruption, a non-volatile memory stores absolute position information of a rotary shaft calculated by a primary controller prior to power interruption.

Specifically, how the primary controller calculates the absolute position information of the rotary shaft is described hereinafter in detail.

Step 702: Upon power interruption, in a first mode, a controller controls a Hall sensor to start operating, and acquires turn count information of the rotary shaft via the Hall sensor.

The first mode is a low power consumption mode, that is, an operating mode of the controller. In the first mode, the controller enables a timer and starts timing, the timer is interrupted when a timing period is reached, the Hall sensor is controlled to start operating, a level of the Hall sensor is detected, and a current turn count information of the rotary shaft is calculated. Specifically, a first pin is opened, such that the first pin is in communication with a power pin and thus supplies power for the Hall sensor to control the Hall sensor to start operating. The controller judges power interruption or power on of the system based on an external interrupt signal. For example, when it is detected that an external interrupt pin has a high level, it is determined that the system is powered on; and when it is detected that the external interrupt pin has a low level, it is determined that the system is power interrupted. Specifically, an interrupt signal is sent by the primary controller to a low power consumption controller to trigger different operating modes of the low power consumption controller. Upon power interruption, the system is in a power off state.

Step 703: Upon power on, in a second mode, the controller controls the Hall sensor not to operate, and the primary controller acquires relative position information of the rotary shaft via the single-turn absolute encoder.

The second mode is a sleep mode, that is, a non-operating mode of the controller. In the second mode, the controller disables the timer, and does not open the first pin. Therefore, the Hall sensor is supplied with no power, and thus does not operate.

Step 704: The primary controller reads the absolute position information of the rotary shaft stored by the non-volatile memory in previous power interruption, the turn count information of the rotary shaft acquired by the controller upon power interruption, and the relative position information of the rotary shaft acquired by the single-turn absolute encoder upon power on.

The process that the primary controller reads the turn count information of the rotary shaft acquired by the controller upon power interruption includes the following steps:

Step A1: The primary controller sends an address of the controller to the controller.

Step A2: The controller receives the address and judges whether the address matches a practical address of the controller.

Step A3: The controller returns an address match acknowledge message to the primary controller if the controller judges that the address matches the practical address of the controller.

Step A4: The primary controller sends a data read instruction to the controller.

Step A5: The controller returns the acquired turn count information of the rotary shaft to the primary controller based on the received data read instruction.

Step 705: The primary controller calculates the absolute position information of the rotary shaft based on the absolute position information of the rotary shaft stored in previous power interruption, the turn count information of the rotary shaft and the relative position information of the rotary shaft.

The absolute position information of the rotary shaft is calculated based on:

$W=INT(X+Y)+Z$; wherein W represents the absolute position information of the rotary shaft, X represents the absolute position information of the rotary shaft stored in previous power interruption, Y represents the turn count information of the rotary shaft, Z represents the relative position information of the rotary shaft, and INT represents rounding up.

For example, if the absolute position information of the rotary shaft stored in previous power interruption is 2.0, $X=2.0$; if the rotary shaft turns about half of one turn and the turn count information of the rotary shaft acquired by the Hall sensor is 0.5 upon power interruption, $Y=0.5$; if the rotary shaft turns about 0.3 turn upon power on and the relative position information of the rotary shaft acquired by the single-turn absolute encoder is 0.3, $Z=0.3$. $W=INT(X+Y)+Z=INT(2.0+0.5)+0.3=INT(2.5)+0.3-2.0+0.3=2.3$.

In the encoding method of the multi-turn absolute encoder according to the embodiment of the present disclosure, the relative position information of the rotary shaft is acquired by the single-turn absolute encoder based on rotation of the magnet upon power on, the controller controls the Hall sensor to acquire the turn count information of the rotary shaft based on rotation of the magnet upon power interruption, the primary controller calculates the absolute position information of the rotary shaft based on the turn count information of the rotary shaft, the relative position information of the rotary shaft and the absolute position information of the rotary shaft stored in previous power interruption. As compared with the multi-turn absolute encoder in the prior art, the multi-turn absolute encoder according to the embodiment of the present disclosure does not employ a mechanical gear set, and thus has a simple structure, a small size and a low cost and may be simply integrated. In addition, the measurement scope is not restricted. Since no grating code disc is used, no higher requirement is imposed on the use environment.

Figure 8:
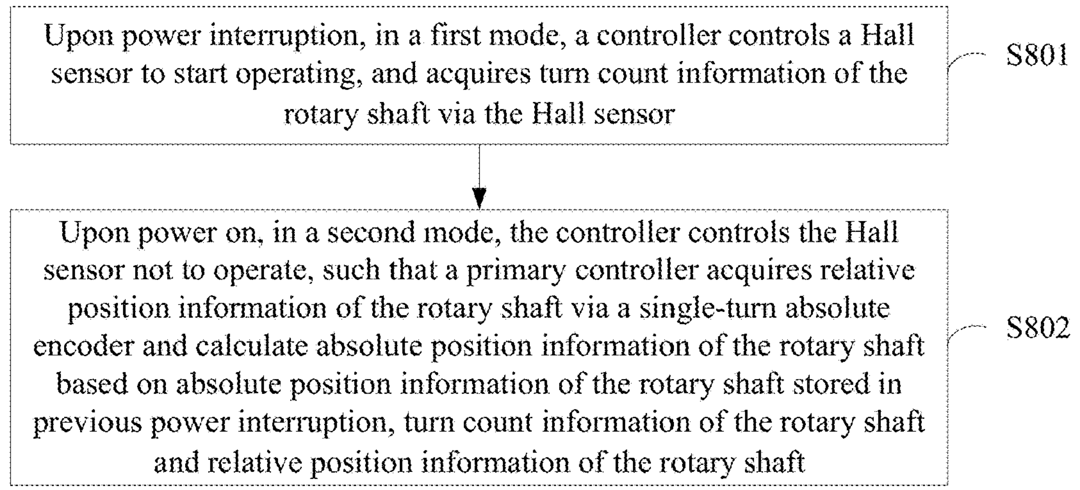
FIG. 8 is a flowchart of an encoding method of a controller in a multi-turn absolute encoder according to an embodiment of the present disclosure.

An embodiment of the present disclosure further provides an encoding method of the multi-turn absolute encoder. The method may be applied to a low power consumption device. As illustrated in FIG. 8, the method includes the following steps:

Step 801: Upon power interruption, in a first mode, a controller controls a Hall sensor to start operating, and acquires turn count information of the rotary shaft via the Hall sensor.

Step 802: Upon power on, in a second mode, the controller controls the Hall sensor not to operate, such that a primary controller acquires relative position information of the rotary shaft via a single-turn absolute encoder and calculate absolute position information of the rotary shaft based on absolute position information of the rotary shaft stored in previous power interruption, turn count information of the rotary shaft and relative position information of the rotary shaft.

The specific implementation of this method may be referenced to the above embodiment of the encoding method of the multi-turn absolute encoder, which is not described herein any further.

Hereinafter, using the scenario where the controller in FIG. 8 is a low power consumption controller as an example, an operating process of the controller is described in detail with reference to a specific embodiment.

Figure 9:
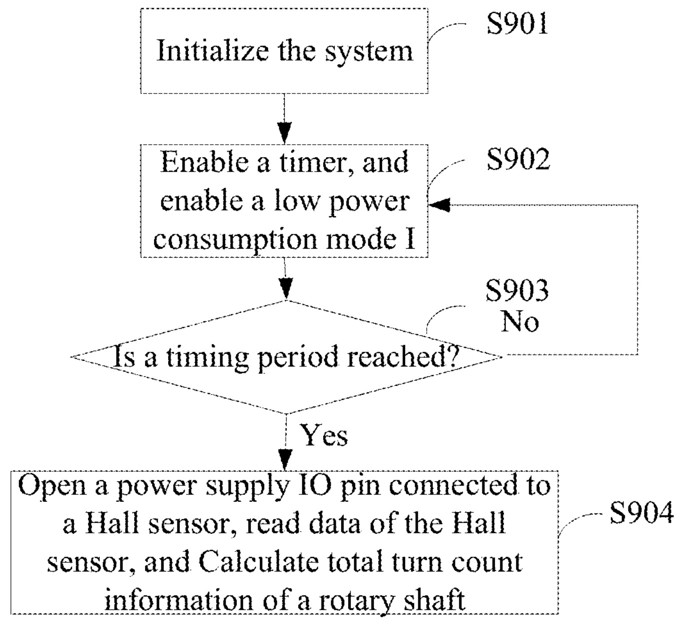
FIG. 9 is a flowchart of first initialization of a controller in a multi-turn absolute encoder according to an embodiment of the present disclosure.

As illustrated in FIG. 9, a process of first initialization of a low power consumption controller includes the following steps:

Step 901: The system is initialized.

Step 902: A timer is enabled, and a low power consumption mode I is enabled.

Step 903: Whether a timing period is reached is judged; if the timing period is reached, step 904 is performed; and otherwise, the process returns to step 902.

Step 904: A power supply IO pin connected to a Hall sensor is opened, data of the Hall sensor is read, and total turn count information of a rotary shaft is calculated.

In this embodiment, during the first initialization of the low power consumption controller, the low power consumption controller is firstly powered before initialization, enters the low power consumption mode I, and enters a time interruption mode after the timing period is reached. During interruption of the timer, the low power consumption device controls the IO pin to open the power pin of the Hall sensor, and then detect the level of the Hall sensor and calculate the turn count of the current rotary shaft.

Figure 10:
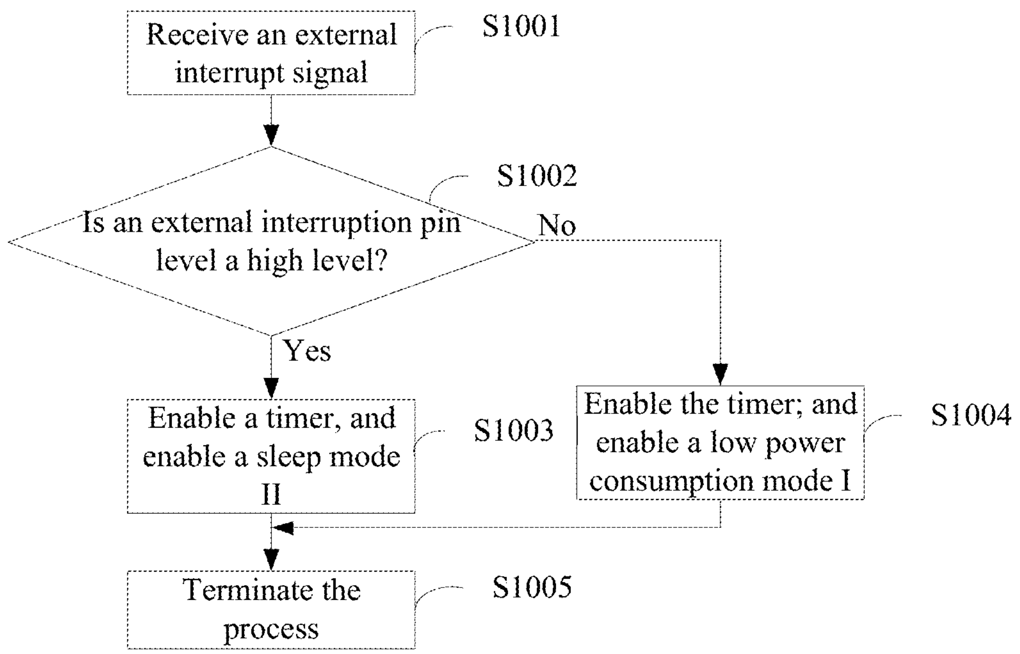
FIG. 10 is a processing flowchart of receiving an external interrupt signal by a controller according to a specific embodiment of the present disclosure.

As illustrated in FIG. 10, a process of receiving an external interrupt signal by a low power consumption controller includes the following steps:

Step 1001: An external interrupt signal is received.

Step 1002: Whether an external interruption pin level is a high level is judged; if the external interruption pin level is a high level, step 1003 is performed; and otherwise, step 1004 is performed.

Step 1003: A timer is disabled, and a sleep mode II is enabled.

Step 1004: The timer is enabled, and the low power consumption mode I is enabled.

Step 1005: The process is terminated.

In this embodiment, the low power consumption controller judges whether the system is powered on based on the external interrupt signal; when it is judged that the system is powered on, the low power consumption controller enters the sleep mode II; and in this case, the timer of the low power consumption controller is disabled, and the turn count information of the rotary shaft is not acquired any further via the Hall sensor, and instead the single-turn absolute encoder of the primary comptroller acquires the relative position information of the rotary shaft. After the system is powered off, the lower power consumption controller detects power off of the system based on the external interrupt pin, and enters an external interrupt processing program, enables the timer and enters the low power consumption mode I. In this case, the turn count information of the rotary shaft is acquired via the Hall sensor.

Figure 11:
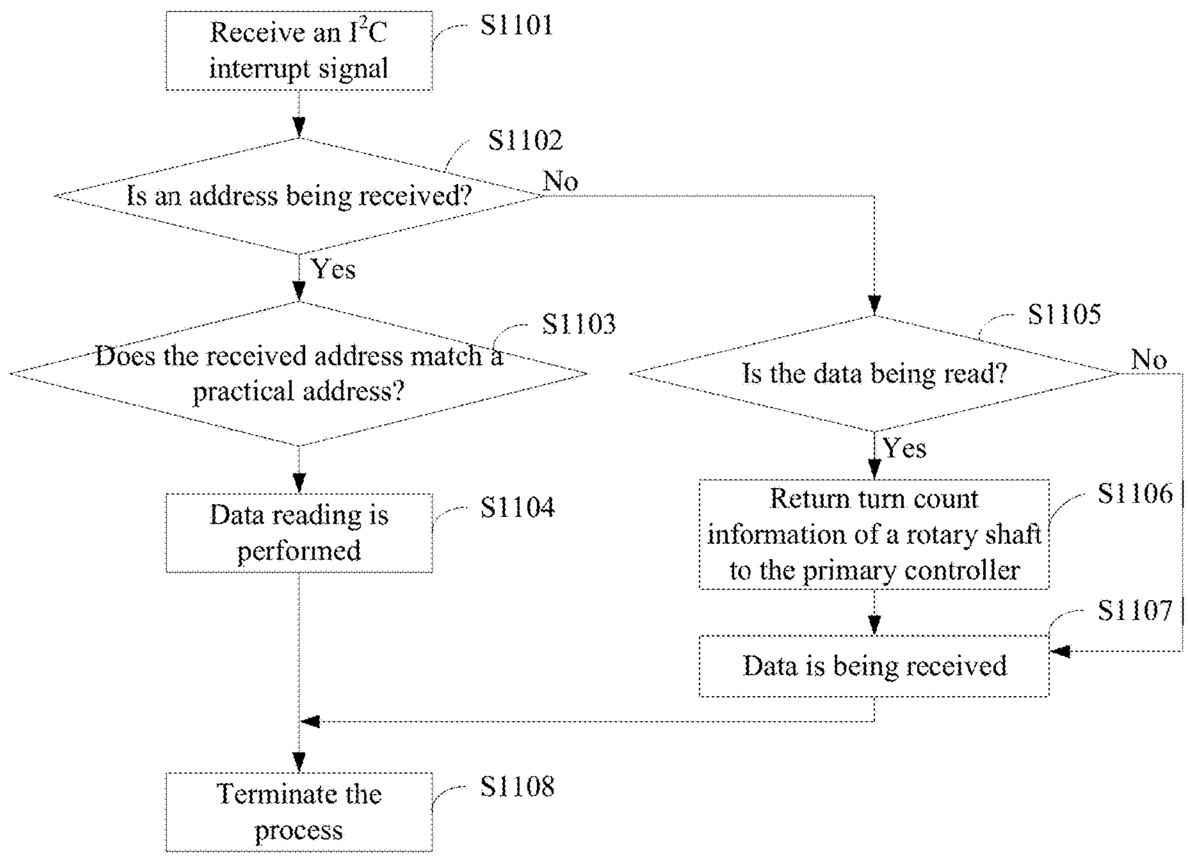
FIG. 11 is a flowchart of reading data from a controller according to a specific embodiment of the present disclosure.

As illustrated in FIG. 11, a process of reading data of a low power consumption controller includes the following steps:

Step 1101: An $I^2C$ interrupt signal is received. The $I^2C$ interrupt signal is sent by a primary controller via an $I^2C$ bus.

Step 1102: Whether an address is being received is judged; if an address is being received, step 1103 is performed; and otherwise, step 1105 is performed.

Step 1103: Whether the received address matches a practical address; if the received address matches the practical address, step 1104 is performed; and otherwise, step 1108 is performed.

Step 1104: Data reading is performed.

Step 1105: Whether the data is being read is judged; if the data is being read, step 1106 is performed; and otherwise, step 1107 is performed.

Step 1106: Turn count information of a rotary shaft is returned to the primary controller.

Step 1107: Data is being received.

Step 1108: The process is terminated.

In this embodiment, the primary controller reads, via the $I^2C$ bus, the turn count information acquired by the low power consumption controller. Firstly, the primary controller sends an address of the low power consumption controller to the low power consumption controller. If the address matches a practical address thereof, a command of writing or reading data is sent. Upon receiving the command, the low power consumption controller returns the turn count information, and the primary controller terminates the communication.

Figure 12:
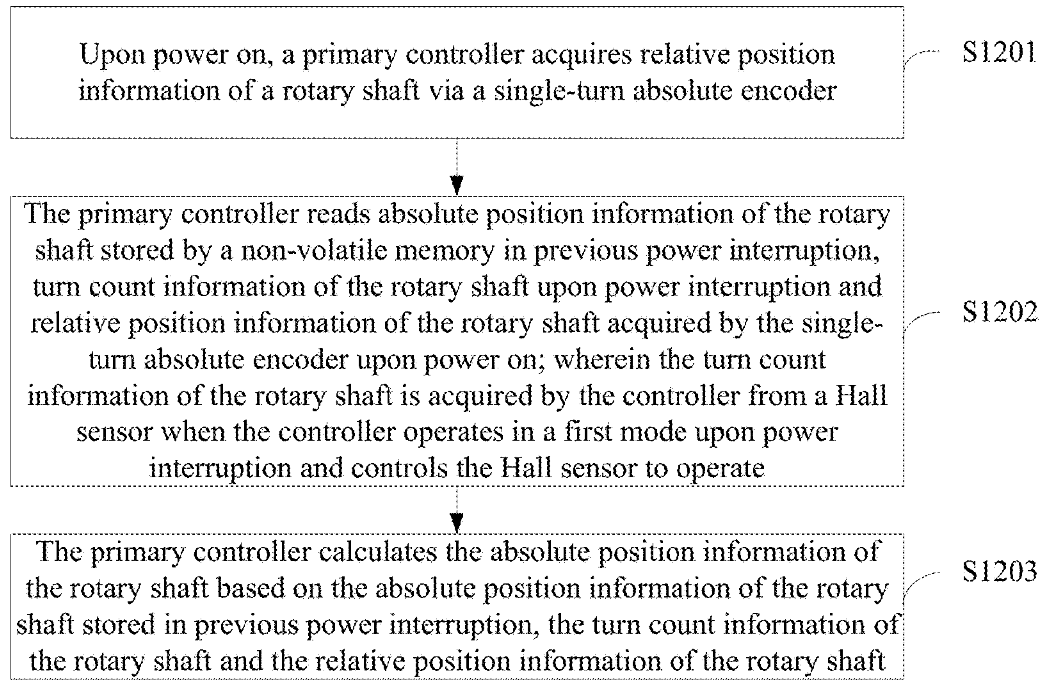
FIG. 12 is a flowchart of an encoding method of a primary controller in a multi-turn absolute encoder according to an embodiment of the present disclosure.

An embodiment of the present disclosure further provides an encoding method of the multi-turn absolute encoder. The method may be applied to a primary controller. As illustrated in FIG. 12, the method includes the following steps:

Step 1201: Upon power on, a primary controller acquires relative position information of a rotary shaft via a single-turn absolute encoder.

Step 1202: The primary controller reads absolute position information of the rotary shaft stored by a non-volatile memory in previous power interruption, turn count information of the rotary shaft upon power interruption and relative position information of the rotary shaft acquired by the single-turn absolute encoder upon power on; wherein the turn count information of the rotary shaft is acquired by the controller from a Hall sensor when the controller operates in a first mode upon power interruption and controls the Hall sensor to operate.

Step 1203: The primary controller calculates the absolute position information of the rotary shaft based on the absolute position information of the rotary shaft stored in previous power interruption, the turn count information of the rotary shaft and the relative position information of the rotary shaft.

The specific implementation of this method may be referenced to the above embodiment of the encoding method of the multi-turn absolute encoder, which is not described herein any further.

Hereinafter, using the scenario where the controller in FIG. 12 is a primary controller as an example, an operating process of the controller is described in detail with reference to a specific embodiment.

Figure 13:
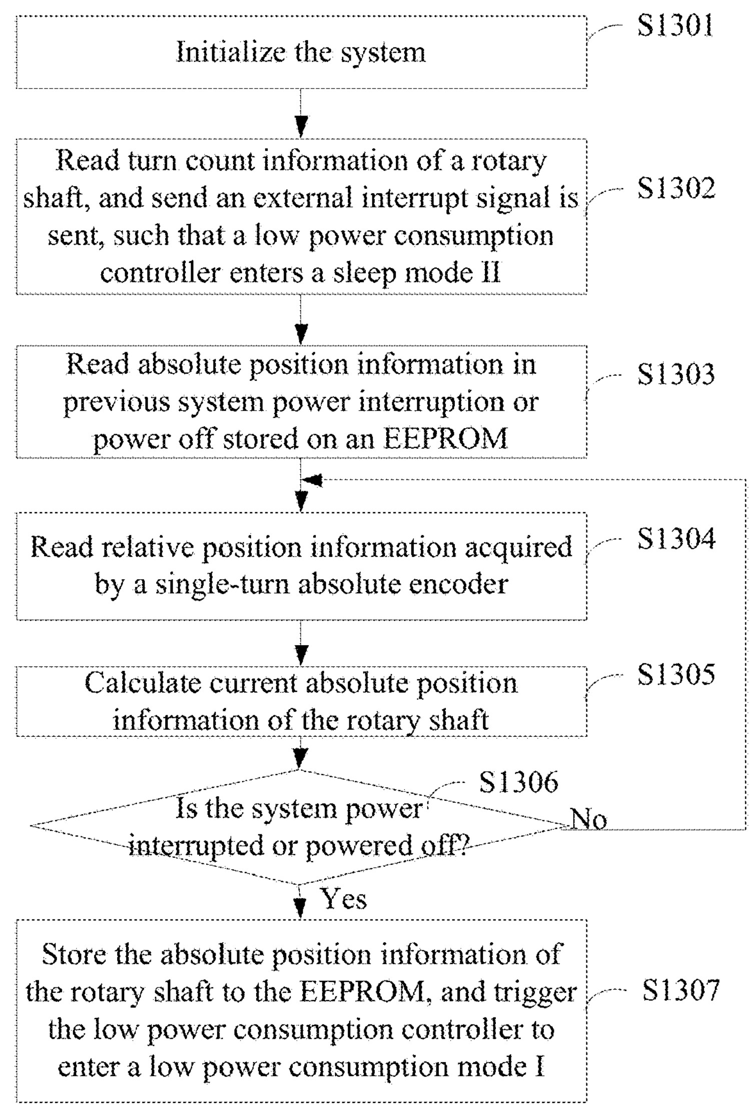
FIG. 13 is an operational flowchart of a primary controller according to a specific embodiment of the present disclosure.

As illustrated in FIG. 13, an operating process of a primary controller includes the following steps:

Step 1301: The system is initialized.

Step 1302: Turn count information of a rotary shaft is read, and an external interrupt signal is sent, such that a low power consumption controller enters a sleep mode II.

Step 1303: Absolute position information in previous system power interruption or power off stored on an EEPROM is read.

Step 1304: Relative position information acquired by a single-turn absolute encoder is read.

Step 1305: Current absolute position information of the rotary shaft is calculated.

Step 1306: Whether the system is power interrupted or powered off is judged; if the system is power interrupted or powered off, step 1307 is performed; and otherwise, the process returns to step 1304.

Step 1307: The absolute position information of the rotary shaft is stored to the EEPROM, and the low power consumption controller is triggered to enter a low power consumption mode I.

In this embodiment, after the primary controller is powered on, initialization is performed, including, initialization of GPIO, SPI bus, $I^2C$ bus and the like. Firstly, the turn count information of the rotary shaft stored by the low power consumption controller upon power interruption of the system, and secondly, the absolute position information of the rotary shaft stored by the EEPROM in power off of the system is read, and finally, the relative position information of the rotary shaft acquired by the single-turn absolute encoder is read. Based on the above three pieces of position information, the absolute position information of the rotary shaft upon multiple turns is calculated. The specific calculation manner may be referenced to the calculation method in the above embodiment of the encoding method of the multi-turn absolute encoder, which is not described herein any further.

Figure 14:
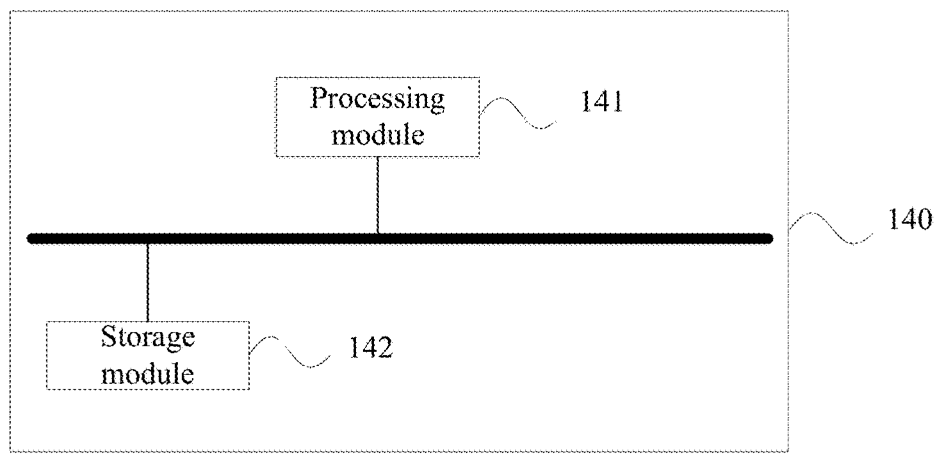
FIG. 14 is a structural block diagram of a controller according to an embodiment of the present disclosure.

An embodiment of the present disclosure further provides a controller 14. The controller may be the low power consumption controller as described in the above embodiment. As illustrated in FIG. 14, the controller 140 includes a processing module 141 and a storage module 142 communicably connected to the processing module 141; wherein the storage module 142 stores instructions that are executable by the processing module 141. The instructions, when being executed by the processing module 141, cause the processing module 141 to perform the steps of the encoding method of the controller (for example, the low power consumption controller) as described in the above embodiment.

Figure 15:
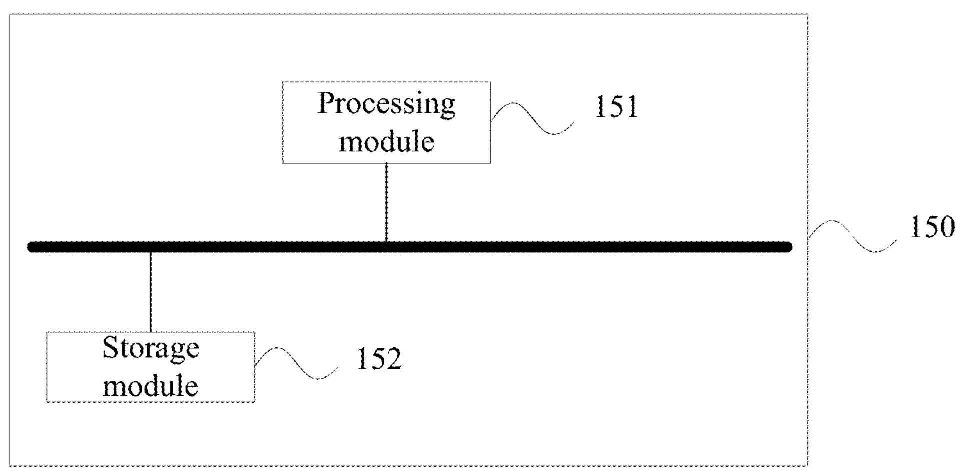
FIG. 15 is a structural block diagram of a primary controller according to an embodiment of the present disclosure.

An embodiment of the present disclosure further provides a controller 150. The controller may be the primary controller as described in the above embodiment. As illustrated in FIG. 15, the controller 150 includes a processing module 151 and a storage module 151 communicably connected to the processing module 152; wherein the storage module 152 stores instructions that are executable by the processing module 151. The instructions, when being executed by the processing module 151, cause the processing module 151 to perform the steps of the encoding method of the controller (for example, the primary controller) as described in the above embodiment.

It should be noted that the above controller, for example, the low power consumption controller, and the primary controller, may both be practiced by an integrated circuit (IC) chip. In this case, the processing module and the storage module are integrated in the IC chip.

It should be noted that since the contents such as information interactions between the modules in the controllers are based on the same inventive concept as method embodiments of the present disclosure, the specific contents may refer to the description of the method embodiments of the present disclosure, which are not defined herein any further.

An embodiment of the present disclosure further provides a computer-readable storage medium, wherein the computer-readable storage medium stores computer executable instructions, which, when being executed by a processing module, cause the processing module to perform the steps in the encoding method of the controller (for example, the low power consumption controller) as described above.

An embodiment of the present disclosure further provides a computer-readable storage medium, wherein the computer-readable storage medium stores computer executable instructions, which, when being executed by a processing module, cause the processing module to perform the steps in the encoding method of the controller (for example, the primary controller) as described above.

An embodiment of the present disclosure further provides a robot, wherein the robot is provided with the multi-turn absolute encoder as described above.

Persons of ordinary skill in the art may understand that all or part of the steps of the methods in the embodiments may be implemented by a program instructing relevant hardware. The program may be stored in a computer readable storage medium. When the program runs, the steps of the methods in the above embodiments are performed. The storage medium may be any medium capable of storing program codes, such as a magnetic disk, an optical disc, a read-only memory (ROM), a random access memory (RAM) or the like.

Described above are exemplary embodiments of the present disclosure, but are not intended to limit the scope of the present disclosure. Any equivalent structure or equivalent process variation made based on the specification and drawings of the present disclosure, which is directly or indirectly applied in other related technical fields, fall within the scope of the present disclosure.

What is claimed is:

1. A multi-turn absolute encoder, comprising a rotary shaft, wherein the multi-turn absolute encoder further comprises:

- a control circuit board, one side of which is vertically provided with the rotary shaft;
- a magnet, disposed on one side of the control circuit board, connected to the rotary shaft, and configured to synchronously rotate about the rotary shaft;
- a Hall sensor, disposed at a position corresponding to the magnet on the other side of the control circuit board, and configured to acquire turn count information of the rotary shaft upon power interruption;
- a controller, disposed on the control circuit board, electrically connected to the Hall sensor, power supplied by a battery, and configured to acquire data of the Hall sensor upon power interruption;
- a primary controller, disposed on the control circuit board, and electrically connected to the controller;
- a single-turn absolute encoder, disposed at a position below the magnet on one side of the control circuit board, electrically connected to the primary controller, and configured to acquire relative position information of the rotary shaft upon power on; and
- a non-volatile memory, disposed on the control circuit board, electrically connected to the primary controller, and configured to, in power interruption, store absolute position information of the rotary shaft calculated by the primary controller prior to power interruption;

wherein the primary controller is configured to calculate the absolute position information of the rotary shaft based on the turn count information of the rotary shaft, the relative position information of the rotary shaft and the absolute position information of the rotary shaft stored in previous power interruption.

2. The multi-turn absolute encoder according to claim 1, wherein the Hall sensor comprises a first bipolar Hall sensor and a second bipolar Hall sensor; wherein the first bipolar Hall sensor and the second bipolar Hall sensor are orthogonally disposed on the control circuit board, and wherein a distance between the Hall sensor and the magnet is less than or equal to 2.5 mm.

3. The multi-turn absolute encoder according to claim 1, wherein the controller is a low power consumption controller.

4. The multi-turn absolute encoder according to claim 1, wherein a distance between the single-turn absolute encoder and the magnet is less than or equal to 2 mm.

5. The multi-turn absolute encoder according to claim 1, wherein the controller is connected to a power pin and a signal output pin of the Hall sensor respectively via a first pin and a second pin, and configured to open the first pin in power interruption, such that the first pin is in communication with the power pin.

6. The multi-turn absolute encoder according to claim 1, wherein the primary controller is disposed on one side of the control circuit board, and wherein the controller is disposed on the other side of the control circuit board.

7. The multi-turn absolute encoder according to claim 1, wherein the primary controller and the controller are connected via an $I^2C$ bus, and wherein the primary controller and the single-turn absolute encoder are connected via an SPI bus.

8. An encoding method of the multi-turn absolute encoder as defined in claim 1, comprising:

in power interruption, storing, by the non-volatile memory, the absolute position information of the rotary shaft calculated by the primary controller prior to power interruption;

upon power interruption, in a first mode, controlling, by the controller, the Hall sensor to start operating, and acquiring the turn count information of the rotary shaft via the Hall sensor;

upon power on, in a second mode, controlling, by the controller, the Hall sensor not to operate, and acquiring, by the primary controller, the relative position information of the rotary shaft via the single-turn absolute encoder;

reading, by the primary controller, the absolute position information of the rotary shaft stored by the non-volatile memory in previous power interruption, the turn count information of the rotary shaft acquired by the controller upon power interruption, and the relative position information of the rotary shaft acquired by the single-turn absolute encoder upon power on; and calculating, by the primary controller the absolute position information of the rotary shaft based on the absolute position information of the rotary shaft stored in the previous power interruption, the turn count information of the rotary shaft and the relative position information of the rotary shaft.

9. The method according to claim 8, wherein in the first mode, the controller enables a timer and starts timing, the timer is interrupted when a timing period is reached, the Hall sensor is controlled to start operating, a level of the Hall sensor is detected, and a current turn count information of the rotary shaft is calculated.

10. The method according to claim 9, wherein the controller is connected to a power pin and a signal output pin of the Hall sensor respectively via a first pin and a second pin, and wherein the controlling the Hall sensor to start operating comprises:

opening the first pin, such that the first pin is in communication with the power pin and power is supplied for the Hall sensor.

11. The method according to claim 8, wherein in the second mode, the controller disables the timer.

12. The method according to claim 8, wherein the controller judges power interruption and power on based on an external interrupt signal.

13. The method according to claim 8, wherein the reading, by the primary controller, the turn count information of the rotary shaft acquired by the controller upon power interruption comprises:

sending, by the primary controller, an address of the controller to the controller;

receiving, by the controller, the address, and judging whether the address matches a practical address of the controller;

returning, by the controller, an address match acknowledge message to the primary controller if the controller judges that the address matches the practical address of the controller;

sending, by the primary controller, a data read instruction to the controller; and returning, by the controller, the acquired turn count information of the rotary shaft to the primary controller based on the received data read instruction.

14. The method according to claim 8, wherein the calculating, by the primary controller the absolute position information of the rotary shaft based on the absolute position information of the rotary shaft stored in previous power interruption, the turn count information of the rotary shaft and the relative position information of the rotary shaft is performed based on:

$W=INT(X+Y)+Z$; wherein W represents the absolute position information of the rotary shaft, X represents the absolute position information of the rotary shaft stored in previous power interruption, Y represents the turn count information of the rotary shaft, Z represents the relative position information of the rotary shaft, and INT represents rounding up.

15. A robot, comprising a multi-turn absolute encoder, wherein the multi-turn absolute encoder comprises a rotary shaft, and wherein the multi-turn absolute encoder further comprises:

a control circuit board, one side of which is vertically provided with the rotary shaft;

a magnet, disposed on one side of the control circuit board, connected to the rotary shaft, and configured to synchronously rotate about the rotary shaft;

a Hall sensor, disposed at a position corresponding to the magnet on the other side of the control circuit board, and configured to acquire turn count information of the rotary shaft upon power interruption;

a controller, disposed on the control circuit board, electrically connected to the Hall sensor, power supplied by a battery, and configured to acquire data of the Hall sensor upon power interruption;

a primary controller, disposed on the control circuit board, and electrically connected to the controller;

a single-turn absolute encoder, disposed at a position below the magnet on one side of the control circuit board, electrically connected to the primary controller, and configured to acquire relative position information of the rotary shaft upon power on; and a non-volatile memory, disposed on the control circuit board, electrically connected to the primary controller, and configured to, in power interruption, store absolute position information of the rotary shaft calculated by the primary controller prior to power interruption;

wherein the primary controller is configured to calculate the absolute position information of the rotary shaft based on the turn count information of the rotary shaft, the relative position information of the rotary shaft and the absolute position information of the rotary shaft stored in previous power interruption.

16. The robot according to claim 15, wherein the Hall sensor comprises a first bipolar Hall sensor and a second bipolar Hall sensor; wherein the first bipolar Hall sensor and the second bipolar Hall sensor are orthogonally disposed on the control circuit board, and wherein a distance between the Hall sensor and the magnet is less than or equal to 2.5 mm.

17. The robot according to claim 15, wherein the controller is a low power consumption controller.

18. The robot according to claim 15, wherein a distance between the single-turn absolute encoder and the magnet is less than or equal to 2 mm.

19. The robot according to claim 15, wherein the controller is connected to a power pin and a signal output pin of the Hall sensor respectively via a first pin and a second pin, and configured to open the first pin in power interruption, such that the first pin is in communication with the power pin.

20. The robot according to claim 15, wherein the primary controller is disposed on one side of the control circuit board, and wherein the controller is disposed on the other side of the control circuit board.

* * * * *